United States Patent
Khrushchev

(10) Patent No.: US 10,416,464 B2
(45) Date of Patent: Sep. 17, 2019

(54) ILLUMINATION DEVICE HAVING A LIGHT SOURCE FOR EMITTING ILLUMINATION LIGHT

(71) Applicant: OSRAM GmbH, Munich (DE)

(72) Inventor: Sergey Khrushchev, Regensburg (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 16/038,186

(22) Filed: Jul. 18, 2018

(65) Prior Publication Data
US 2019/0033605 A1 Jan. 31, 2019

(30) Foreign Application Priority Data

Jul. 28, 2017 (DE) ........................ 10 2017 213 102

(51) Int. Cl.
| | | |
|---|---|---|
| *G03B 21/00* | (2006.01) | |
| *H04N 9/31* | (2006.01) | |
| *G02B 27/10* | (2006.01) | |
| *H01L 27/146* | (2006.01) | |
| *G02B 27/09* | (2006.01) | |

(52) U.S. Cl.
CPC ..... *G02B 27/1026* (2013.01); *G02B 27/0977* (2013.01); *G03B 21/008* (2013.01); *H01L 27/14645* (2013.01); *H04N 9/3111* (2013.01)

(58) Field of Classification Search
CPC .. G03B 21/008; H04N 9/3111; H04N 9/3194; H04N 9/3182
See application file for complete search history.

(56) References Cited

U.S. PATENT DOCUMENTS

| | | | | |
|---|---|---|---|---|
| 6,479,811 B1 * | 11/2002 | Kruschwitz | ........ | G02B 26/0808 250/237 G |
| 7,172,295 B2 * | 2/2007 | Engle | .................. | G03B 21/005 353/122 |
| 2009/0128451 A1 * | 5/2009 | Tokui | .................... | G03B 33/08 345/55 |
| 2009/0284148 A1 * | 11/2009 | Iwanaga | .............. | G02B 26/008 313/506 |

FOREIGN PATENT DOCUMENTS

| | | |
|---|---|---|
| DE | 102014017521 A1 | 6/2016 |
| DE | 102016200590 A1 | 7/2017 |
| JP | 2004163876 A | 6/2004 |

OTHER PUBLICATIONS

German Search Report based on application No. 10 2017 213 102.0 dated Feb. 5, 2018 (8 pages) (for reference purpose only).

* cited by examiner

Primary Examiner — Ryan D Howard

(57) ABSTRACT

An illumination device includes a light source, a micromirror array including a plurality of micromirror actuators, an illumination optical unit, and an optical sensor unit having a sensitive sensor surface. The illumination light is guided onto the micromirror actuators and is reflected at the latter and with the reflection in the temporal integral. An on beam is reflected by the micromirror actuators in a respective on tilt position via the illumination optical unit to an illumination application. An off beam is reflected by the micromirror actuators in a respective off tilt position alongside the illumination optical unit. The sensor unit is arranged in the off beam, in order to capture a radiation guided in the off beam at least in the case of a fault. The sensor unit is oriented in such a way that the sensor surface lies obliquely with respect to a main incidence direction of the radiation.

16 Claims, 2 Drawing Sheets

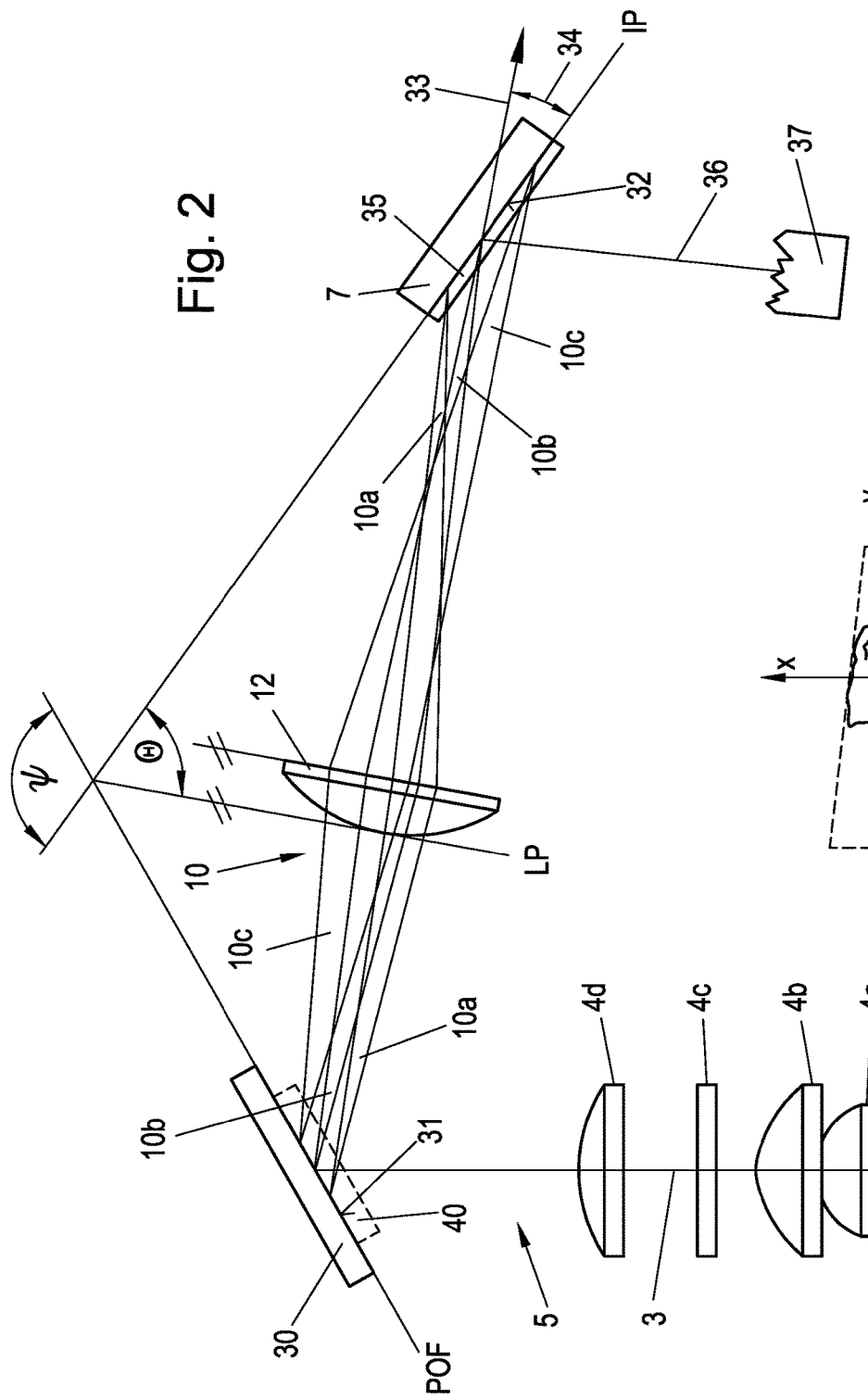
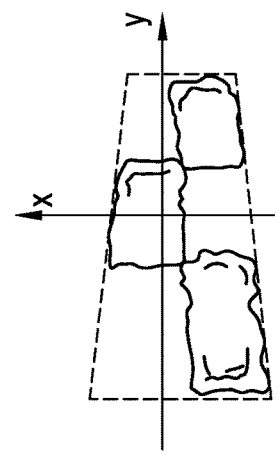

ILLUMINATION DEVICE HAVING A LIGHT SOURCE FOR EMITTING ILLUMINATION LIGHT

CROSS-REFERENCE TO RELATED APPLICATION

This application claims priority to German Patent Application Serial No. 10 2017 213 102.0, which was filed Jul. 28, 2017, and is incorporated herein by reference in its entirety.

TECHNICAL FIELD

Various embodiments relate generally to an illumination device having a light source for emitting illumination light, a micromirror array and a illumination optical unit.

BACKGROUND

A micromirror array is constructed from a multiplicity of micromirrors which are arranged in matrix form and which are switchable and thus tiltable as actuators independently of one another. In projection applications, such micromirror arrays are used as image generators. Each micromirror actuator thus corresponds to a pixel, wherein depending on the tilt position the light of specific color (e.g. red, green and blue) that is incident thereon at respective points in time is forwarded for the purpose of imaging in an on beam onto the projection surface, or is guided in an off beam alongside the illumination optical unit and is not used.

SUMMARY

An illumination device includes a light source, a micromirror array including a plurality of micromirror actuators, an illumination optical unit, and an optical sensor unit having a sensitive sensor surface. The illumination light is guided onto the micromirror actuators and is reflected at the latter and with the reflection in the temporal integral. An on beam is reflected by the micromirror actuators in a respective on tilt position via the illumination optical unit to an illumination application. An off beam is reflected by the micromirror actuators in a respective off tilt position alongside the illumination optical unit. The sensor unit is arranged in the off beam, in order to capture a radiation guided in the off beam at least in the case of a fault. The sensor unit is oriented in such a way that the sensor surface lies obliquely with respect to a main incidence direction of the radiation.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows an illumination device according to various embodiments with a detailed illustration of the beam guiding in an off beam of the micromirror array; and FIG. 3 shows the irradiance distribution on a sensor unit of the illumination device in accordance with FIG. 2 in the case of an exemplary interconnection of the micromirror array.

DESCRIPTION

Figure 1:
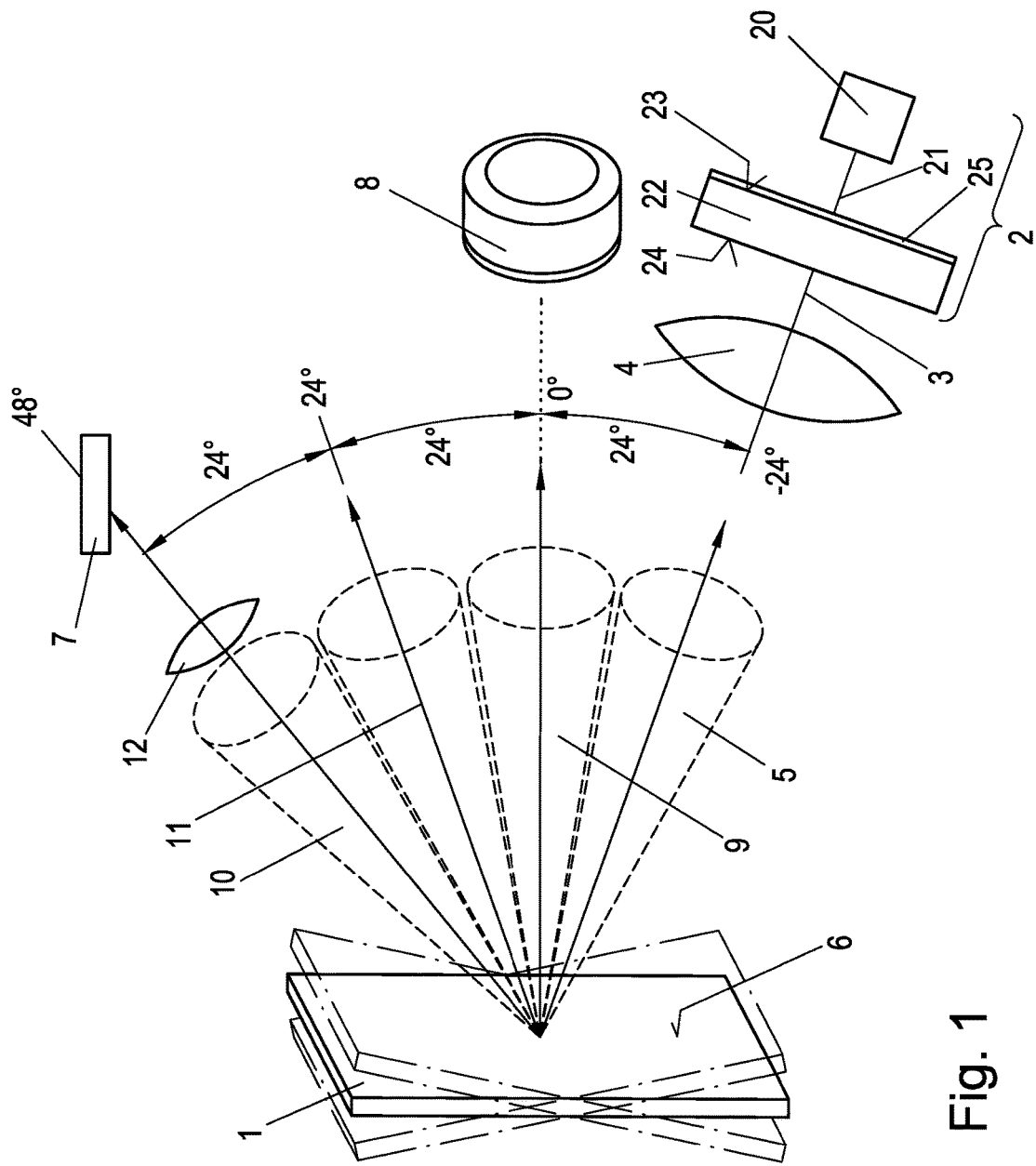
FIG. 1 shows an illumination device according to various embodiments in a schematic illustration for elucidating the beam guiding in different beams at a micromirror array.

The following detailed description refers to the accompanying drawings that show, by way of illustration, specific details and embodiments in which the invention may be practiced.

Various embodiments address the technical problem of specifying a particularly advantageous illumination device.

According to various embodiments, this problem is solved by an illumination device as claimed in claim 1. Said illumination device includes an optical sensor unit having a sensitive sensor surface, which is arranged in the off beam and serves for capturing a radiation guided in the off beam. In this case the sensor unit is oriented in such a way that the sensor surface lies obliquely with respect to a main incidence direction of the radiation, that is to say not perpendicularly thereto (and not parallel either). The sensor unit can be used e.g. for monitoring the light source or the micromirror array, wherein the arrangement in the off beam can afford e.g. efficiency advantages (the illumination light guided there is not required anyway on the illumination side). With the sensor surface oriented obliquely with respect to the main incidence direction, e.g. back reflections from the sensor surface to the micromirror array can be at least reduced. This can be advantageous e.g. with regard to the image generation or generation of a specific light intensity distribution on the illumination side which might otherwise be disturbed by back reflections from the sensor unit via the micromirror array through the illumination optical unit. Back reflections can also be disturbing for the light source.

Various embodiments are found in the dependent claims and the entire disclosure, wherein a distinction is not always specifically drawn between device and method and/or use aspects in the explanation; the disclosure should be read at all events implicitly with regard to all claim categories.

With the sensor unit, e.g. the functionality of the micromirror array (also referred to hereinafter merely as "array") can be monitored, e.g. in the case of a spatially resolved capture (see below). By way of example, micromirror actuators (also referred to hereinafter merely as "actuators") can be damaged, for instance no longer tilt in a functionally conforming manner on account of locally high power densities ("sticking"). One preferred field of application is in the area of motor vehicle lighting (see below), wherein in particular vibrations or the mechanical loading generally, also in conjunction with greatly differing ambient temperatures, can cause damage to the array or else to the light source.

Monitoring the light source may e.g. also be of interest in order to be able to identify and avoid an undesired emergence of radiation having a high radiance in the case of a fault, for instance in the case of a damaged light source. The light source can comprise e.g. a pump radiation source and a phosphor element for at least proportionally converting the pump radiation (see below in detail), and in the case of a damaged, for instance fractured/cracked phosphor element, the generally focused pump radiation could emerge toward the illumination application. On the illumination application side this can constitute a considerable photobiological risk, for instance for an observer can result in damage to the retina and, in the worst case, loss of sight. In the case of the illumination device according to the invention, e.g. an evaluation unit that ascertains an irregularity in the measurement signal of the sensor unit can cause a control unit of the light source to effect at least a power reduction (dimming) or even a complete switch-off; this can be done for the light source in its entirety or else in a spatially resolved manner only in partial regions (see below).

In the case of a light source with phosphor element, the latter can occasionally also detach in its entirety from a mechanical mount or from a carrier, for instance on account of a failing joining connection layer. In this case, too, the pump radiation could propagate toward the illumination application in a focused manner. Moreover, an undesired/dangerous propagation of radiation also need not, however, necessarily arise from a defect of the light source itself, but rather may e.g. also be caused by a defect of one of the optical elements for beam guiding.

For illustration purposes, various possibilities will now firstly be discussed beforehand regarding what the "radiation", for the capture of which the sensor unit is provided, can be (details are found below). In the case of a light source including pump radiation source and phosphor element, the sensor unit can be configured e.g. for capturing the pump radiation, e.g. also exclusively the pump radiation. In the case of a phosphor element operated in full conversion, in which the entire pump radiation is converted, radiation would then be incident on the sensor unit not at all during normal operation, but rather only in the case of a fault (fractured/cracked/fallen phosphor element). On the other hand, however, radiation can also be incident on the sensor surface already during normal operation; specifically, the sensor unit can be configured e.g. for capturing the illumination light. In the case of capturing pump radiation, too, a degree of detection is possible during normal operation, however, if the illumination light contains proportionally non-converted pump radiation (so-called partial conversion, see below).

Generally, in the context of this disclosure, a "main direction" of radiation or light (e.g. the main incidence direction) arises as an average value—formed in the temporal integral—of all direction vectors along which the respective radiation or the respective light propagates in the respective section, wherein each direction vector is weighted with the radiant intensity associated therewith during this averaging. The consideration is effected in the temporal integral because usually not all the actuators are simultaneously in the same tilt position; also cf. the remarks below. The main incidence direction lies "obliquely" with respect to the sensor surface, that is to say deviates at least a little from an orientation perpendicular or parallel thereto.

In various embodiments, the micromirror array is used for adaptive road illumination in which e.g. other road users are selectively excluded from the illumination in order to avoid dazzle (see below in detail). The illumination light emitted by the light source is reflected at the micromirror actuators of the micromirror array, that is to say a respective partial beam per actuator. Depending on the tilt position of the respective actuator, the respective partial beam is reflected via the illumination optical unit to the illumination application (on tilt position) or alongside the latter and is not fed to the illumination application. By way of the tilt position of the actuators, a light distribution in the far field can thus be set in a targeted manner.

The totality of all partial beams that are reflected by the actuators in each case in the on tilt position forms the "on beam"; the totality of all partial beams reflected by the actuators in the respective off tilt positon forms the off beam.

The on and off beams arise in each case in the temporal integral (not all actuators simultaneously in the same tilt position or generally operated in an oscillating manner). A temporal integral can encompass a time duration in the microseconds range and/or milliseconds range and/or seconds range and/or minutes range and/or longer.

Between the on and off beams there can also be a further beam (transient beam), which can correspond to a non-deflected state of the actuators, so-called transient flat state, which is not used any further; also cf. the exemplary embodiment for illustration purposes. On the other hand, however, on and off beams can also lie directly alongside one another, that is say in other words the transient flat state can also be actively used.

The illumination optical unit is assigned to the micromirror array in such a way that the illumination light guided by different micromirror actuators in the on tilt position through the illumination optical unit passes in different spatial directions. The light distribution in position space in the array plane is thus translated into a light distribution in angle space in the far field. By selectively switching on/off a respective actuator, it is accordingly possible for a respective spatial direction or a solid angle range to be selectively supplied with illumination light, or indeed not.

A vehicle ahead or oncoming vehicle that is captured by e.g. a camera system of the motor vehicle can thus be excluded from the light cone e.g. in a targeted manner by the respectively assigned actuators thus being switched off (brought to a corresponding tilt position)(a respective tilt position need not necessarily be permanently assumed even within an operating period; oscillatory tilting back and forth can also be superimposed). This is intended to illustrate one exemplary field of application, but not to restrict the concept of the invention in the generality thereof.

The illumination optical unit may generally also include a reflector; an exclusively refractive illumination optical unit may be provided. In general, a non-imaging illumination optical unit is also conceivable, but it may be imaging. The illumination optical unit may e.g. include a lens, e.g. a converging lens, wherein the lens can also be constructed in the manner of a lens system composed of a plurality of individual lenses (arranged successively with respect to transillumination). Preference is given to an arrangement such that the illumination optical unit images the micromirror array, that is to say the actuators, into infinity.

The "micromirror array" (in principle a MEMS array, LCOS or a Grating Light Valve and comparable adjustably reflective arrangements can also be considered; a Digital Micromirror Device, DMD, may be provided) may include e.g. at least 10, 100, 500, 1,000, 5,000, 10,000 or 30,000 micromirror actuators and (independently thereof) for example not more than $1\times10^8$, $1\times10^7$ or $1\times10^6$ micromirror actuators (with increasing preference respectively in the order mentioned). The actuators may be part of the same semiconductor component (chip). They are not necessarily switchable completely independently of one another, but rather can e.g. also be combined in groups already on the chip side. In other words by way of example, it is also possible for a plurality of micromirror actuators arranged alongside one another jointly to supply a solid angle range, or indeed not, in other words then all to be switched on or off. With regard to specific operating modes, too, such as e.g. high beam, low beam, daytime running light, etc., already original groupwise combination is also possible.

In various embodiments, the main incidence direction forms with the sensor surface an inclination angle that is at least 10°, more and e.g. at least 15° or 20°. Various upper limits, which in general may also be of interest and are intended to be disclosed independently of the lower limits, are at most 80°, 70°, 60° or 50°, with increasing preference in the order mentioned. The inclination angle is the smaller of two angles that the main incidence direction forms with the sensor surface (the two angles added together yield 180°). In the case of a non-planar sensor surface, the inclination angle is taken relative to a tangential plane to the sensor surface (the tangential plane lies at the geometric area centroid). In various embodiments, however, the sensor surface is planar, including generally.

In various embodiments, an imaging optical unit is arranged in the off beam, said imaging optical unit imaging an actuator surface of the array onto the sensor surface. The actuator surface is that surface in which the reflection surfaces of the actuators lie, e.g. in the de-energized state. The imaging optical unit optionally provided is a converging lens, e.g. a single lens. The use of a single lens may be provided for space or else weight reasons (reference is also made to remarks below concerning the CCD sensor). Independently of the configuration of the imaging optical unit in specific detail, each actuator or each group of actuators thus brings the light respectively guided via it respectively onto a dedicated, defined region of the sensor surface (a spatial distribution on the array correlates with a spatial distribution on the sensor surface).

In various embodiments, the illumination light guided in the off beam has at the micromirror array a main reflection direction that lies obliquely with respect to the actuator surface of the array, that is to say not perpendicularly thereto (and not parallel either). With regard to the "main reflection direction", reference is made to the above remarks concerning the main direction. Thus both the sensor surface and the actuator surface are then situated in each case obliquely in the beam, specifically in each case with a different sign (obliquely in opposite directions), which can help to improve the accuracy of the imaging (the theoretical background can be illustrated by the so-called Scheimpflug principle). It is thus possible e.g. to increase the sharpness of the imaging and to reduce or avoid so-called "crosstalk" that is to say the superimposition of individual pixel beams.

Various embodiments may provide an arrangement in which $\tan(\psi)=((m+1)/m)\cdot\tan(\theta)$, wherein m is the optical magnification of the sensor optical unit, θ is the angle between the lens plane (LP) of the sensor optical unit and the image plane (IP) and ψ is the angle between image plane (IP) and plane of focus (POF). In this case, the actuator surface lies in the plane of focus and the sensor surface lies in the image plane (and the respective plane is correspondingly defined). For illustration purposes, reference is also made to FIG. 2.

The main reflection direction can form with the actuator surface an inclination angle (see above) of e.g. at least 10°, 20°, 30° or 35°, with possible upper limits (independent thereof) at e.g. at most 80°, 70°, 60° or 55° (with increasing preference respectively in the order mentioned). By way of example, 42° may be provided.

In various embodiments, the sensor unit is designed for a radiation capture which is spatially resolved over the sensor surface; a matrix-shaped spatial resolution (in rows and columns) may be provided. A CMOS sensor or e.g. a CCD sensor can be provided as the sensor unit. The spatial resolution can enable a certain assignment to a deviation captured by the sensor unit. It is possible to ascertain and assign e.g. damage ("sticking", mechanical fracture, etc.) to one actuator or a group of actuators, which, by way of example, depending on relevance to light distributions that are typically to be generated, can enable a categorization (less critical/critical) already during operation. An assignment may also be provided in the case of damage to the phosphor element (crack, fracture, etc.) because a spatial distribution on an emission surface of the phosphor element e.g. correlates with a spatial distribution on the array (the spatial distribution on the array then in turn e.g. correlates with a spatial distribution on the sensor surface, see above). Generally an imaging optical unit ("feed optical unit") may be provided between phosphor element and array.

The corresponding actuators can then remain e.g. permanently in the off state. In the motor vehicle application, the defect can be indicated to the vehicle driver in order to urge the latter to visit a workshop, for instance by means of a warning lamp in the vehicle interior or the like. It is then possible, for example, for only some of the actuators, which are at a sufficient distance from the actuators assigned to the damage region, to be operated in emergency light operation. The localization of the damage can also be read out, for instance in the workshop, or else be automatically output to the manufacturer in order e.g. to instigate the provision of appropriate spare parts. In the case of a plurality of defect sites and/or large-area defect sites, dimming or even complete turn-off of the light source can also be implemented.

However, a CCD sensor can also afford advantages over e.g. a photodiode and be correspondingly preferred independently of a fault assignment, namely on account of the larger sensor surface area. The sensor surface area of preferred CCD sensors has an area diagonal of at least 6 mm, and more and particularly preferably at least 8 mm, or 10 mm, wherein possible upper limits (independently thereof) can be e.g. at most 50 mm, 40 mm, 30 mm, 20 mm, 18 mm, 16 mm or 14 mm. By way of example, 12 mm may be provided, whereas customary photodiodes generally have an area of only around $1\times 2$ mm$^2$. One effect of the larger sensor surface area is manifested in an etendue consideration: if an aperture angle that is defined at the array is assumed, the imaging onto a smaller image area (photodiode) requires a lens of higher reflective index or a more complex optical unit than the imaging to the larger sensor surface area of the CCD sensor. The provision of a simpler optical unit, e.g. of a single lens (see above), may be provided for weight and e.g. space reasons (structural space). Various effects can arise from a manufacturing standpoint, too, owing to the simpler mounting and/or adjustment.

In various embodiments, the light source includes a pump radiation source and a phosphor element preferably spaced apart therefrom, whereby very high luminances can be realized. The phosphor element converts the pump radiation at least proportionally into a conversion light; the latter can form the illumination light by itself (full conversion) or else in a mixture with proportionally non-converted pump radiation. Even if pump radiation passes to the illumination application in this case, this is generally non-critical, in contrast to the fault cases described, because the proportionally non-converted pump radiation is fanned out, e.g. on account of scattering processes in the phosphor element. If the phosphor element is damaged, for instance fractured, or else has completely fallen off, more and in addition focused pump radiation passes to the illumination application.

A laser source may be provided as the pump radiation source, which laser source can e.g. also be constructed from a plurality of individual laser sources. In various embodiments, a laser diode is provided as the laser source or individual laser source. The phosphor element includes a wavelength-converting phosphor, e.g. cerium-doped yttrium aluminum garnet (YAG:Ce). The phosphor can be embedded e.g. in particle form into a matrix material, but it is also possible for agglomerated phosphor particles or else a single crystal of the phosphor to form the phosphor element. The illumination light may generally provide white light, which can be achieved e.g. with the YAG:Ce emitting yellow conversion light in the case of partial conversion with blue pump light.

The pump radiation is incident on an incidence surface of the phosphor element, and the conversion light is emitted at an emission surface. In general, operation in reflection is also possible, that is to say that the incidence surface and the emission surface can coincide, and e.g. a mirror could then be arranged on the opposite side surface of the phosphor element. In various embodiments, the phosphor element is operated in transmission, that is to say that the incidence surface and the emission surface lie opposite one another. At the incidence surface, a dichroitic coating can be provided, for example, which is transmissive to the pump radiation incident thereon but reflective to the conversion light thereupon generated in the phosphor element.

In various embodiments, a beam splitter is arranged in the off beam. At said beam splitter the radiation is split not necessarily at every point in time, but anyway in the case of a consideration in the temporal integral (over normal operation and fault case). Specifically, in the case for instance of a beam splitter that splits pump radiation and conversion light, in the case of full conversion on that path downstream of the beam splitter which is provided for guiding the pump radiation, radiation can also be guided not at all during normal operation, but rather only in the case of a fault. On the other hand, however, the illumination light can also be split at the beam splitter already during normal operation, see below.

The beam splitter may be provided as a plate and be upstream of the sensor surface. In this respect "plate" denotes an optical component which is produced by itself beforehand and which is then combined with the sensor unit (and the other components). The plate may be arranged between an imaging optical unit (see above) and the sensor surface; by way of example, it can also be placed directly onto the sensor surface. A plane-parallel plate may be provided, which can help to prevent imaging aberrations, for example.

The plate may be situated obliquely with respect to the main direction in the off beam, for instance at an angle of at least 30°, e.g. at least 40°, with possible upper limits (independent thereof) at e.g. at most 60°, e.g. at most 50°. 45° may be provided; the angle between plate surface and direction is considered.

In various embodiments, the plate is mounted displaceably in the off beam, e.g. obliquely with respect to a main direction of the off beam, e.g. parallel to the sensor surface. The mounting can e.g. also enable a linear shifting; a rotatable mounting may be provided. The plate can thus e.g. be rotatable about a rotation axis parallel to the thickness direction of the plate. Independently thereof, in specific detail the respectively irradiated region can be varied with the displacement of the plate. By way of example, different mirror layers can be provided in the different regions of the plate, for instance a wavelength-dependent mirror layer in one region and a polarization-dependent mirror layer in another region (also see below). The respective mechanism of beam splitting can thus be varied by displacing the plate.

In various embodiments, the beam splitter is applied as a coating on the sensor surface itself or on a housing window of the sensor unit. Thus e.g. a dichroic layer system (see below) forming the beam splitter is deposited directly onto the sensor surface. In general, a plurality of beam splitters can also be provided, that is to say that the sensor surface can be coated and in addition a plate can be provided; by way of example, these are alternatives, that is to say only exactly one beam splitter is arranged in the off beam.

The possibilities described below can be implemented both in the case of a configuration as coating and in the case of a plate.

In various embodiments, at least one part of the illumination light guided in the off beam is guided via the beam splitter onto an absorber, e.g. into a beam trap, that is to say into a beam dump. In the temporal integral, relative to the radiation intensity e.g. at least 50%, 60%, 70% or 80% of the illumination light can be guided into the beam trap; upper limits can be 95% or 90%, but it is also possible for the entire illumination light to be guided into the beam trap. The at least partial splitting of illumination light may generally be provided with regard to the sensor unit, e.g. help to avoid an excessively high irradiance on the sensor surface.

The beam splitter can e.g. also be spectrally non-selective. That is to say that illumination light of the same or substantially the same spectral composition can be guided on both paths downstream of the beam splitter, wherein generally the smaller portion reaches the sensor unit and the larger portion passes into the beam trap. In the case of a light source pump radiation source and phosphor element, a corresponding configuration can be of interest in particular if the sensor unit monitors the pump radiation/conversion light ratio, e.g. as blue/yellow ratio.

In various embodiments relating to the light source including pump radiation source and phosphor element, the beam splitter is configured in such a way that the pump radiation reaches the sensor surface via said beam splitter at least in the case of a fault. The beam splitter can be reflective to the pump radiation or the conversion light, but transmit the respective other radiation. During normal operation, too, for instance in the case of a partial conversion, pump radiation can reach a corresponding sensor unit, but with a lower intensity or irradiance in comparison with the fault case. By way of example, a threshold value can be stored in an evaluation unit, the exceedance of which threshold value indicates a fault case (threshold).

In various embodiments, the beam splitter includes a wavelength-dependent mirror layer, also referred to as "dichroic mirror". A corresponding layer can be constructed from a plurality of individual layers, for example, with which dielectric materials having different refractive indices succeed one another. As an alternative or in addition to the wavelength-dependent selection a polarization-dependent mirror layer can also be provided, which e.g. is transmissive only to p-polarized radiation, but reflective to s-polarized radiation (or vice versa). The pump radiation may be linearly polarized upstream of the phosphor element; by way of example, it is already emitted in a linearly polarized fashion by the pump radiation source (e.g. in the case of a laser diode).

The polarization-dependent layer can be provided e.g. in such a way that during normal operation no or hardly any radiation reaches the sensor surface. Even in the case of a partial conversion, the polarization-dependent mirror layer can be arranged in such a way that the proportionally non-converted pump radiation, the linear polarization of which is largely cancelled on account of scattering processes etc. in the phosphor element, does not "fit", that is to say that pump radiation at most proportionally reaches the sensor surface. By contrast, in the case of a fault (fallen phosphor element, but also fracture etc.) the pump radiation then reaches the polarization-dependent mirror layer predominantly or at least with a significantly increased proportion in a p-polarized fashion and is guided onto the sensor surface.

In various embodiments, the beam splitter is provided in such a way that it is transmissive to the radiation guided onto the sensor surface at least in the case of a fault. By contrast, it is then reflective to the illumination light guided e.g. into a beam trap. In other words, in the path toward the sensor unit the beam splitter may constitute a plane-parallel plate through which radiation is transmitted, which can enable a simpler construction with regard to the desired imaging of the actuator surface onto the sensor surface. In general, the radiation guided onto the sensor surface can however also be reflected at the beam splitter.

In various embodiments, the illumination device includes an evaluation unit configured to compare the sensor signal captured by the sensor unit with a setpoint value. In the case of the CCD sensor, for instance, a plurality of setpoint values can also be provided with a spatial distribution, that is to say for each actuator or groupwise (a setpoint value can then contain e.g. information about position, size and expected radiation power). A setpoint value can be stored by the manufacturer, for instance as a simulated value or e.g. as a measured value. A measured value can be determined on a structurally identical illumination device; e.g. to calibrating each illumination device by itself, for example in the context of the respective production process or the respective final inspection.

An adaptation or else, if appropriate, a repeated redetermination of the setpoint value can also be provided, for example at intervals, for instance upon every start-up of the illumination device. In this case, the actuators can be measured sequentially, but it is also not necessary for each actuator to be measured individually, rather groupwise combination is also possible, e.g. in rows. On the basis of corresponding setpoint values determined e.g. upon start-up, it is then possible to monitor the development across operation, that is to say whether the measured values develop away from the setpoint values (taking account of certain tolerances etc.).

Various embodiments also relate to a method for operating an illumination device disclosed in the present case, or an illumination device with evaluation unit, wherein the sensor signal is compared with the setpoint value. Reference is expressly made to the paragraphs above.

Various embodiments also relate to a use of the illumination device for illumination. Even though applications in the field of projection (video, cinema), in effect and entertainment lighting or else in the field of architainment are conceivable, too, various embodiments relate to the use of an illumination device disclosed in the present case for vehicle lighting, e.g. in a front headlight. In general, use in a ship or else aircraft or helicopter is also conceivable; e.g. a motor vehicle, e.g. an automobile. The road illumination may be adaptive, that is to say that other road users are selectively excluded from the illumination in order to avoid dazzle.

A solid angle volume which can be maximally filled by the illumination light cone is segmented, e.g. subdivided into rows and columns, and only those segments are switched out in which the other road user was ascertained, e.g. another motor vehicle, or else a pedestrian or cyclist. In this case, actuators can also be combined groupwise, e.g. with per group at least 10, 50, 100 actuators and (independently) e.g. not more than 1000 or 500 actuators. By way of example, a cornering light can also be realized and/or objects (e.g. wild animal at the edge of the roadway or else persons) can also be illuminated in a targeted manner, for instance for the purpose of marking (hazard identification).

In various embodiments, the array is operated depending on a vehicle sensor measurement, e.g. depending on one or more camera images. The camera images can be subdivided in accordance with the segmentation of the maximally accessible illumination light cone, wherein each segment is then assigned one or more actuators of the array. If another road user is ascertained in a segment, the corresponding actuators are brought to the off state.

FIG. 1 shows an illumination device according to various embodiments including a micromirror actuator 1, which is part of an array of actuators (not illustrated in its entirety) and is supplied with illumination light 3 by a light source 2. The illumination light 3 passes through a converging lens as feed optical unit 4 and is incident in the form of a feed beam 5 on the micromirror array. For illustration reasons, only one micromirror actuator 1 of the array is shown, nevertheless the fed/reflected light is illustrated on the basis of the beams, that is to say relative to the array in its entirety.

The micromirror actuator 1 is illustrated in the non-deflected state. It is tiltable back and forth between two maximum tilt positions, which are indicated by dashed lines. The non-deflected state is referred to as the transient flat state and in the present case one maximum tilt position corresponds to the on tilt position, and the other to the off tilt position. In the off tilt position, the micromirror actuator 1 reflects the illumination light incident on its mirror surface 6 according to various embodiments onto a sensor unit 7. In the on tilt position, by contrast, the illumination light is guided through an illumination optical unit 8 (a lens system) and thus used in the present case for generating a light distribution in the far field, specifically for adaptive road illumination in a motor vehicle front headlight.

FIG. 1 furthermore illustrates how a total angular range of 96°, which is accessible overall owing to the tiltability of the micromirror actuators 1 by +/−12° in the present case, can be divided. In said total angular range, the on beam 9 (to the illumination optical unit 8), the off beam 10 (onto the sensor unit 7) and the transient beam 11 are illustrated in addition to the feed beam 5. The on beam 9 and the off beam 10 are spaced apart from one another by the transient beam 11 in order, for a good contrast, as far as possible to keep unintended reflections out of the on beam 9. Said reflections can occur to an increased extent in the transient flat state because the mirror surfaces of the actuators here lie parallel to the chip plane and reflections from the rest of the chip surface (connection webs, metallization, etc.) can thus also be introduced.

In the case of the illumination device according to various embodiments, the illumination light guided in the off beam 10 is not entirely annihilated in an absorber (beam dump). Instead the radiation is guided via a converging lens as sensor optical unit 12 onto the sensor unit 7 and used for state monitoring of the light source 2. This may be provided insofar as on the one hand it actually becomes possible to monitor the light source 2, but on the other hand this does not mean a loss of efficiency because the radiation guided in the off beam 10 is in principle not used for illumination purposes anyway (in any case not for a primary light function, at most after recycling or for a secondary light function).

The light source 2 is constructed from a pump radiation source 20 and a phosphor element 22. A laser diode is provided as the pump radiation source 20 (a plurality of laser diodes are also possible). The pump radiation 21 emitted thereby is blue laser light in the present case. The latter is incident generally in a collimated fashion on a phosphor element 22 arranged at a distance therefrom, specifically on the incidence surface 23 thereof.

In response to the excitation with the pump radiation 21, the phosphor element 22 emits a conversion light, which proportionally forms the illumination light 3 and is emitted at the emission surface 24. The emission surface 24 is imaged onto the array by the feed optical unit 4 (the feed optical unit 4 is shown in further detail in FIG. 2). In the present case, the phosphor element comprises YAG:Ce, as phosphor, and the conversion light is yellow light. The pump radiation 21 is only proportionally converted (partial conversion), and a remaining portion of the blue laser light in a mixture with the yellow conversion light forms white light as illumination light 3.

The phosphor element 22 is operated in transmission, and the emission surface 24 lies opposite the incidence surface 23. In order to increase the efficiency, a dichroic coating 25 is provided at the incidence surface 23, said coating being transmissive to the pump radiation 21, but reflective to the conversion light. The phosphor element 22 is arranged on a carrier, e.g. composed of sapphire, which is not illustrated, however. Even if, in the present case, proportionally non-converted pump radiation 21 passes to the illumination application, this is non-critical because the pump radiation 21 is fanned out upon radiation through the phosphor element 22, for instance on account of scattering processes, that is to say passes to the illumination application in a non-focused fashion.

Various fault cases are conceivable, however, in which a critical emergence of pump radiation 21 can occur on the application side. The phosphor element 22 can fall e.g. in its entirety from the carrier; the collimated pump radiation can, however, also already propagate through a crack/fracture of the phosphor element 22. The present illumination device is configured for detecting such a fault in order then, in the case of a fault, to instigate a turn-off of the pump radiation source 20 or an at least partial disconnection of the illumination over the array.

FIG. 2 shows the beam guiding from the micromirror array 30, specifically the actuator surface 31, via the sensor optical unit 12 onto a sensitive sensor surface 32 of the sensor unit 7 in detail. Three partial beams 10a,b,c are shown by way of example, and each emanates from a different region of the actuator surface 31, in the present case respectively from exactly one actuator (however, it is also possible for a plurality of actuators to be combined group-wise).

Via the sensor optical unit 12, the actuator surface 31 is imaged onto the sensitive sensor surface 32. As is evident from FIG. 2, the sensor surface 32 lies obliquely with respect to a main incidence direction 33 along which the radiation is incident thereon (in the present case the illumination light). This may firstly be advantageous with regard to the imaging because in this way, despite the oblique actuator surface 31, each point of the actuator surface 31 can be least approximately imaged onto a respective point of the sensor surface 32 (also cf. the introductory part of the description). Furthermore, the oblique position makes it possible to avoid back reflections onto the array 30 that might otherwise disturb the beam guiding via the illumination optical unit. The illumination optical unit is not illustrated in FIG. 2, for the sake of clarity; reference is made to FIG. 1.

The main incidence direction 33 forms with the sensor surface 32 an inclination angle 34 of around 25°. A beam splitter 35 is arranged at the sensor surface 32, said beam splitter directing a portion 36 of the radiation guided in the off beam 10 into a beam trap 37. Radiation thus passes only proportionally onto the sensor surface 32 and is converted into a measurement signal.

The beam splitter 35 can be placed against the sensor surface 32 as a plate produced separately beforehand, or else can be applied as a coating on the sensor surface 32 (cf. the introductory part of the description). The beam splitter, as a dichroic coating, can e.g. be transmissive only to the pump radiation, but reflective for the rest. In the case of a fault, an increased pump radiation intensity would then be ascertained. With the beam splitter, however, even without spectral selection, illumination light can be guided proportionally into the beam trap 37 in order not to allow the irradiance on the sensor surface 32 to become too high. Furthermore, a polarization-dependent beam splitter is also possible or there are corresponding combinations; reference is expressly made to the introductory part of the description.

FIG. 2 furthermore illustrates in more specific detail the feed optical unit 4, via which the illumination light 3 is guided from the phosphor element 32 onto the actuator surface 31. Alongside three converging lens 4a,b,d, a light mixing means 4c can furthermore be discerned, namely a microlens array, which serves for at least partly intermixing the illumination light 3, but at least partly maintains the correlation of the spatial distributions. Upstream of the actuator surface 31 the illumination light 3 then also passes through a plane-parallel plate 40.

The actuator surface 31 defines a plane of focus (POF) the sensor optical unit 12 defines the lens plane (LP) and the sensor surface 32 defines the image plane (IP). An ideal arrangement is one in which $\tan(\psi)=((m+1)/m)\cdot\tan(\theta)$, wherein m is the magnification of the sensor optical unit 12. For a 4F telescope system it emerges that m=1, that is to say that the condition then reads $\tan(\psi)=2\cdot\tan(\theta)$. For a predefined array size and a given size of the sensor unit, on the other hand, it is possible to calculate the necessary magnification m. A typical array size can be e.g. with a diagonal of 7.62 mm (0.3 inch) (with an aspect ratio of 16:9). Sensor units are available in highly varied sizes and can be selected as required.

FIG. 3 shows, in a schematic illustration, the result of a raytracing simulation for illustrating the good imaging properties of the arrangement illustrated. In this case, an illumination checkered pattern is set on the actuator surface 31 (some actuators are switched off, and others are switched on), and FIG. 3 shows the irradiance on the sensor surface 32; the checkered pattern is imaged well (sharpness, no "crosstalk"; also cf. the introductory part of the description). A checkered field can then be assigned e.g. to exactly one or a defined group of sensor element(s) of the CCD sensor.

LIST OF REFERENCE SIGNS

Headlight/spotlight 1
Pump radiation unit 2
Micromirror actuator 1
Light source 2
Illumination light 3
Feed optical unit 4
    Converging lenses thereof 4a,b,d
    Light mixing means thereof 4c
Beam 5
Sensor unit 7
Illumination optical unit 8
On beam 9
Off beam 10
    Partial beam thereof 10a,b,c Sensor optical unit 12
Pump radiation source 20
Pump radiation 21
Phosphor element 22
Incidence surface 23
Emission surface 24
Micromirror array 30
Actuator surface 31
Sensor surface 32
Main incidence direction 33
Inclination angle 34
Beam splitter 35
Portion (of the radiation guided in the off beam) 36
Beam trap 37
Plane-parallel plate 40
Image plane IP
Plane of focus POF
Lens plane LP While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An illumination device, comprising:
a light source configured to emit an illumination light;
a micromirror array comprising a plurality of micromirror actuators;
an illumination optical unit; and
an optical sensor unit having a sensitive sensor surface;
wherein the illumination light emitted by the light source is guided onto the micromirror actuators and is reflected at the latter and with the reflection in the temporal integral;
an on beam is reflected by the micromirror actuators in a respective on tilt position via the illumination optical unit to an illumination application; and
an off beam is reflected by the micromirror actuators in a respective off tilt position alongside the illumination optical unit;
wherein the optical sensor unit is arranged in the off beam, in order to capture a radiation guided in the off beam at least in the case of a fault; and
wherein the optical sensor unit is oriented in such a way that the sensitive sensor surface lies obliquely with respect to a main incidence direction of the radiation, and
wherein a beam splitter comprising a plane-parallel plate is arranged in the off beam.

2. The illumination device of claim 1,
wherein the main incidence direction forms with the sensitive sensor surface an inclination angle that is at least 10° and at most 80°.

3. The illumination device of claim 1,
wherein an imaging optical unit is arranged in the off beam, said imaging optical unit imaging an actuator surface of the micromirror array onto the sensitive sensor surface.

4. The illumination device of claim 3,
wherein the illumination light guided in the off beam has at the micromirror array a main reflection direction that lies obliquely with respect to the actuator surface of the micromirror array.

5. The illumination device of claim 1,
wherein the optical sensor unit is designed for a radiation capture which is spatially resolved at the sensitive sensor surface.

6. The illumination device of claim 5,
wherein the optical sensor unit is designed as a Complementary Metal-Oxide Semiconductor sensor or a Charge Coupled Device sensor.

7. The illumination device of claim 1,
wherein the light source comprises a pump radiation source for emitting pump radiation, and also a phosphor element for at least partially converting the pump radiation into a conversion light which at least proportionally forms the illumination light.

8. The illumination device of claim 7,
wherein the phosphor element is operated in transmission.

9. The illumination device of claim 1,
wherein at least one part of the illumination light guided in the off beam is guided via the beam splitter onto an absorber.

10. The illumination device of claim 9,
wherein the absorber is a beam trap.

11. The illumination device of claim 1,
wherein the beam splitter comprises at least one of a wavelength-dependent mirror layer or a polarization-dependent mirror layer.

12. The illumination device of claim 1, further comprising:
an evaluation unit configured to compare a sensor signal captured by the sensor unit with a setpoint value.

13. An illumination device, comprising:
a light source configured to emit an illumination light;
a micromirror array comprising a plurality of micromirror actuators;
an illumination optical unit; and
an optical sensor unit having a sensitive sensor surface;
wherein the illumination light emitted by the light source is guided onto the micromirror actuators and is reflected at the latter and with the reflection in the temporal integral;
an on beam is reflected by the micromirror actuators in a respective on tilt position via the illumination optical unit to an illumination application; and
an off beam is reflected by the micromirror actuators in a respective off tilt position alongside the illumination optical unit;
wherein the optical sensor unit is arranged in the off beam, in order to capture a radiation guided in the off beam at least in the case of a fault; and
wherein the optical sensor unit is oriented in such a way that the sensitive sensor surface lies obliquely with respect to a main incidence direction of the radiation; and
a beam splitter (35) arranged in the off beam (10);
wherein the beam splitter is provided as a plate which is mounted displaceably in the off beam in such a way that a region of the plate that is respectively irradiated in the off beam can be varied with the displacement.

14. An illumination device, comprising:
a light source configured to emit an illumination light;
a micromirror array comprising a plurality of micromirror actuators;
an illumination optical unit; and
an optical sensor unit having a sensitive sensor surface;

wherein the illumination light emitted by the light source is guided onto the micromirror actuators and is reflected at the latter and with the reflection in the temporal integral;
   an on beam is reflected by the micromirror actuators in a respective on tilt position via the illumination optical unit to an illumination application; and
   an off beam is reflected by the micromirror actuators in a respective off tilt position alongside the illumination optical unit;
wherein the optical sensor unit is arranged in the off beam, in order to capture a radiation guided in the off beam at least in the case of a fault; and
wherein the optical sensor unit is oriented in such a way that the sensitive sensor surface lies obliquely with respect to a main incidence direction of the radiation; and
a beam splitter (35) arranged in the off beam (10);
wherein the sensitive sensor surface or a window of a housing of the optical sensor unit, which window covers the sensitive sensor surface, is provided with a coating that forms the beam splitter.

15. An illumination device, comprising:
a light source configured to emit an illumination light;
a micromirror array comprising a plurality of micromirror actuators;
an illumination optical unit; and
an optical sensor unit having a sensitive sensor surface;
wherein the illumination light emitted by the light source is guided onto the micromirror actuators and is reflected at the latter and with the reflection in the temporal integral;
   an on beam is reflected by the micromirror actuators in a respective on tilt position via the illumination optical unit to an illumination application; and
   an off beam is reflected by the micromirror actuators in a respective off tilt position alongside the illumination optical unit;
wherein the optical sensor unit is arranged in the off beam, in order to capture a radiation guided in the off beam at least in the case of a fault; and
wherein the optical sensor unit is oriented in such a way that the sensitive sensor surface lies obliquely with respect to a main incidence direction of the radiation; and
a beam splitter (35) arranged in the off beam (10);
wherein the optical sensor unit is designed for a radiation capture which is spatially resolved at the sensitive sensor surface; and
wherein the beam splitter is configured to effect that the pump radiation is guided onto the sensitive sensor surface via said beam splitter at least in the case of a fault.

16. A method for operating an illumination device,
the illumination device comprising:
a light source configured to emit an illumination light;
a micromirror array comprising a plurality of micromirror actuators;
an illumination optical unit; and
an optical sensor unit having a sensitive sensor surface;
wherein the illumination light emitted by the light source is guided onto the micromirror actuators and is reflected at the latter and with the reflection in the temporal integral;
   an on beam is reflected by the micromirror actuators in a respective on tilt position via the illumination optical unit to an illumination application; and
   an off beam is reflected by the micromirror actuators in a respective off tilt position alongside the illumination optical unit;
wherein a beam splitter comprising a plane-parallel plate is arranged in the off beam;
wherein the optical sensor unit is arranged in the off beam, in order to capture a radiation guided in the off beam at least in the case of a fault; and
wherein the optical sensor unit is oriented in such a way that the sensitive sensor surface lies obliquely with respect to a main incidence direction of the radiation;
the method comprising:
providing the sensor unit; and
comparing a sensor signal captured by the sensor unit with a setpoint value.

* * * * *